United States Patent
Hiraide

[11] Patent Number: 5,815,513
[45] Date of Patent: Sep. 29, 1998

[54] TEST PATTERN PREPARATION SYSTEM

[75] Inventor: Takahisa Hiraide, Kawasaki, Japan

[73] Assignee: Fujitsu Limited, Kawasaki, Japan

[21] Appl. No.: 821,728

[22] Filed: Mar. 20, 1997

Related U.S. Application Data

[63] Continuation of Ser. No. 271,746, Jul. 7, 1994, abandoned.

[30] Foreign Application Priority Data

Sep. 30, 1993 [JP] Japan ................................. 5-244955

[51] Int. Cl.$^6$ .......................... G01R 31/28; G06F 11/00; G06F 3/00; G06G 7/48
[52] U.S. Cl. .................. 371/27.4; 395/500; 395/183.09; 364/578
[58] Field of Search .............................. 371/27, 23, 22.4, 371/22.5, 27.1, 27.4, 27.7, 27.5; 364/574, 578, 480, 481, 488, 487, 489, 550, 580, 581, 490; 395/183.08, 183.09, 183.15, 183.13, 500

[56] References Cited

U.S. PATENT DOCUMENTS

| | | | |
|---|---|---|---|
| 4,601,032 | 7/1986 | Robinson | 395/183.09 |
| 5,068,812 | 11/1991 | Schaefer et al. | 364/578 |
| 5,072,178 | 12/1991 | Matsumoto | 371/22.1 |
| 5,127,011 | 6/1992 | Comb et al. | 371/27.3 |
| 5,189,365 | 2/1993 | Ikeda et al. | 395/183.09 |
| 5,243,603 | 9/1993 | Broeren | 371/27.1 |
| 5,278,769 | 1/1994 | Bair et al. | 364/488 |
| 5,377,203 | 12/1994 | Khan | 371/27.7 |
| 5,446,674 | 8/1995 | Ikeda et al. | 371/27.4 |
| 5,465,383 | 11/1995 | Shimono et al. | 371/27.1 |

Primary Examiner—Trinh L. Tu
Attorney, Agent, or Firm—Staas & Halsey

[57] ABSTRACT

A test pattern preparation system for testing an LSI circuit, the system includes: a circuit data file for storing various circuit data; an old test pattern file for storing old test patterns; a test pattern preparation unit for performing a logic simulation, detecting "simultaneous-change action" based on a result of the logic simulation, and preparing a new test pattern in accordance with the circuit data and the old test patterns; and a new test pattern file for storing new test patterns which are prepared by the test pattern preparation unit.

3 Claims, 6 Drawing Sheets

Fig.9D
EVENT
(PIN-C)
DON'T CARE VALUE (X)

TEST PATTERN PREPARATION SYSTEM

This application is a continuation of application Ser. No. 08/271,746, filed Jul. 7, 1994, now abandoned.

BACKGROUND OF THE INVENTION

1. Field of the Invention

The present invention relates to a test pattern preparation system for testing an LSI (Large Scale Integrated) circuit on a production line. Particularly, an improved test pattern according to the present invention can resolve the problem of "simultaneous-change action" which occurs at each output pin in the LSI circuit when it is tested. The problem of "simultaneous-change action" is defined as undesirable change of an operation voltage at each output pin. In other words, "simultaneous-change action" is expressed by "simultaneous switching output noise".

2. Description of the Related Art

As is known, a test pattern is used for detecting structural defects, and for testing various characteristics, for example, voltage, current, frequency, signal response, etc., in an LSI circuit. In general, an LSI circuit is basically formed of at least input buffers for receiving signals from external stages, an internal circuit including a plurality of logic gates for realizing predetermined functions (characteristics), and output buffers connected to various loads. In general, each input buffer is connected to input pins (input pads), and each output buffer is connected to output pins (output pads).

When testing the LSI circuit, a predetermined test pattern is applied to the input pins. Further, a pattern is processed by the internal circuit, i.e., a plurality of gates, output from the output pins and compared with an expected value. In this case, the expected value is previously determined by a logic simulation process (or a fault simulation process) which is performed using a logic simulation apparatus. The result of comparison is used to evaluate various characteristics of the LSI circuit.

As mentioned above, the internal circuit is formed of a plurality of logic gates. Accordingly, when supplying the test pattern to the logic gates through the input pins, the circuit current (voltage) in the logic gates changes in response to the change of an output voltage of each logic gate and output buffers. Further, a power supply voltage, which is supplied to the LSI circuit, also changes in response to the change of the circuit voltage.

Particularly, when the operational voltages of output buffers simultaneously change, the power voltage changes considerably so that the large power noise is induced on the power line. As a result of the power noise, the margin for the operational voltage (or, the dynamic range) of the logic circuit becomes smaller so that an erroneous operation may occur in the LSI circuit.

In general, these changes in the operational voltage are caused by the "simultaneous-change action" of the voltage at the output pins. When testing the LSI circuit by using a conventional test pattern, there is a problem in which erroneous operation may occur in the LSI circuit caused by the "simultaneous-change action".

Conventionally, the three representative methods proposed for resolving the "simultaneous-change action" problem are as follows.

As a first method, when designing an LSI package, a circuit designer designs the LSI package to resist "simultaneous-change action".

As a second method, when designing an LSI circuit, the circuit designer designs the LSI circuit to resist "simultaneous-change action".

As a third method, when preparing a test pattern, the circuit designer designs the test pattern to avoid "simultaneous-change action".

The present invention aims to prepare an improved test pattern which can avoid "simultaneous-change action".

SUMMARY OF THE INVENTION

An object of the present invention is to provide a test pattern preparation system for preparing an improved test pattern which can avoid "simultaneous-change action".

In accordance with the present invention, there is provided a test pattern preparation system for testing an LSI circuit, the system including: a circuit data file for storing various circuit data; an old test pattern file for storing old test patterns; a test pattern preparation unit operatively connected to the circuit data file and the old test pattern file for performing a logic simulation, detecting "simultaneous-change action" based on a result of the logic simulation, and preparing new test pattern in accordance with the circuit data and the old test patterns; and a new test pattern file operatively connected to the test pattern preparation unit for storing new test patterns which are prepared by the test pattern preparation unit.

In a preferred embodiment, the test pattern preparation unit includes: a logic simulation unit for receiving the circuit data from the circuit data storage unit and the old test patterns from the old test pattern storage unit; performing the logic simulation in consideration of signal delay; and recording the name of the input/output pin(s) at which a signal level was changed, the signal level before and after the change, and the time when the signal level was changed;

a simultaneous-change detection unit for calculating the sum of the noise levels at the input/output pins which are provided in the vicinity of a target input/output pins to be checked in accordance with the result of the logic simulation, and recording the noise levels caused by the "simultaneous-change action" at the input/output pins when the sum of the noise level exceeds a threshold value which is previously determined; and a pattern masking unit for setting the signal levels at input/output pins, at which noises are to be considered, to a DON'T CARE value (a value X), performing a re-simulation, and masking all expected values on the test pattern at the output pins, when the influence of the noise is propagated, to the DON'T CARE values. In this case, the DON'T CARE value can take three states, i.e., "0", "1" and "unknown value".

In another preferred embodiment, the simultaneous-change detection unit obtains a weighted noise level in accordance with the distance between the input/output pins to be checked when calculating the sum of the noise levels.

In still another preferred embodiment, the simultaneous-change detection unit obtains a weighted noise level in accordance with a time difference between input/output pins to be checked when calculating the sum of the noise levels.

BRIEF EXPLANATION OF THE DRAWINGS

In the drawings:

FIGS. 9A to 9D are signal timing-charts for explaining an event during a re-simulation using the function test pattern;

DESCRIPTION OF THE PREFERRED EMBODIMENTS

Figure 1:
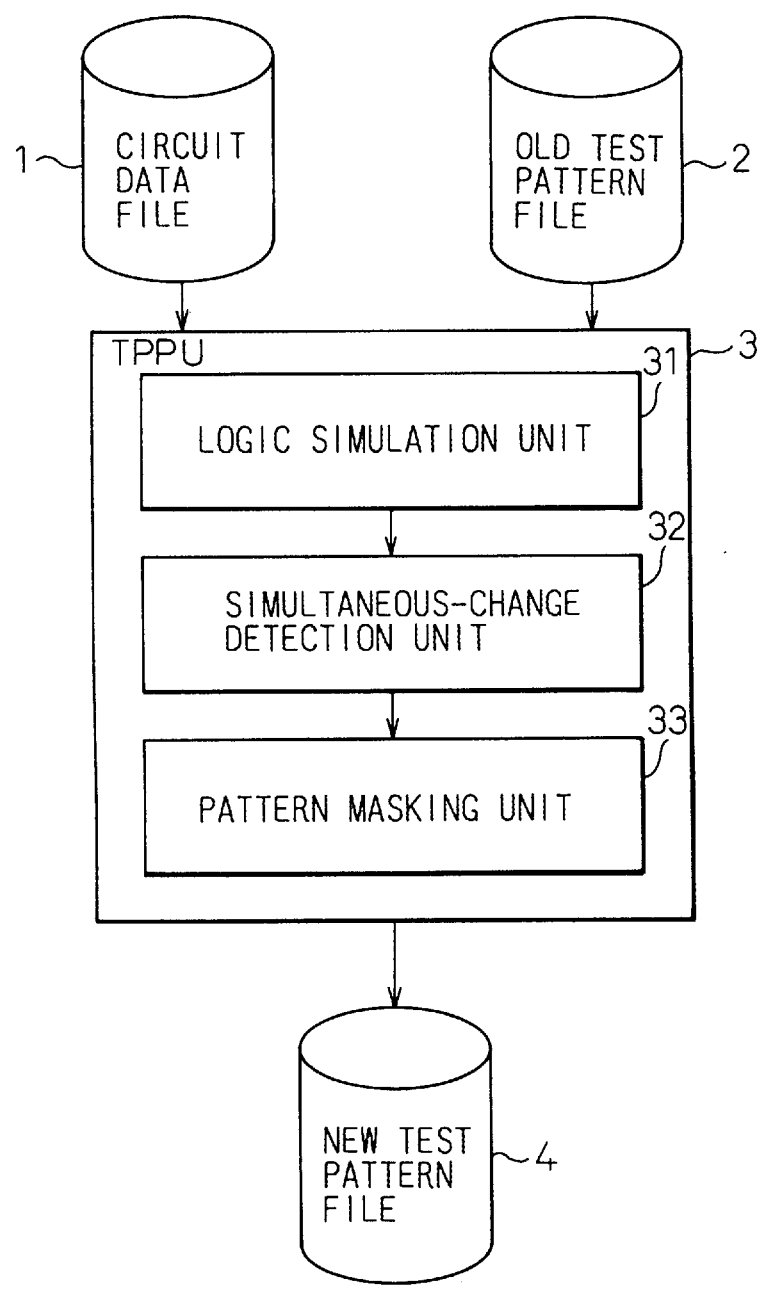
FIG. 1 is a basic block diagram of a test pattern preparation system according to the present invention.

FIG. 1 is a basic block diagram of a test pattern preparation system according to the present invention. In FIG. 1, reference number 1 denotes a circuit data file for storing various circuit data, for example, kinds of circuit elements, connection configuration of internal logic gates and input/output pins, etc. Reference number 2 denotes an old test pattern file for storing old test patterns. The old test patterns do not take the "simultaneous-change action" problem into consideration. Reference number 3 denotes a test pattern preparation unit (TPPU) according to the present invention.

Briefly, the test pattern preparation unit 3 performs a logic simulation, detects the "simultaneous-change action", and prepares a new test pattern in accordance with the circuit data and the old test patterns. Reference number 4 denotes a new test pattern file for storing new test patterns which are prepared by the test pattern preparation unit.

In detail, the test pattern preparation unit 3 includes a logic simulation unit 31, a simultaneous-change detection unit 32, and a pattern masking unit 33.

The logic simulation unit 31 receives the circuit data from the circuit data storage unit 1 and the old test pattern from the old test pattern storage unit 2; performs a logic simulation in consideration of signal delay; and records the name (s) of the input/output pin(s) at which a signal level was changed (i.e., H-L (DOWN), L-H (UP)), the signal level before and after the change, and the time when the signal level was changed.

The simultaneous-change detection unit 32 calculates the sums of the influence of level changes at input/output pins which are provided in the vicinity of target input/output pins to be checked in accordance with the result of the logic simulation, and records the noise level caused by the "simultaneous-change action" at the input/output pins with the pin name and the DON'T CARE value when the sum exceeds a threshold value which is previously determined.

The pattern masking unit 33 sets signal levels at the input/output pins, at which noises are to be considered, to the DON'T CARE value (a value X), again performs the logic simulation (i.e., re-simulation), and masks all expected values on the test pattern at the output pins, which the influence of the noise is propagated, to the DON'T CARE values. In the case that the DON'T CARE value (value X) is set to the input pin and transferred to the output buffer through the internal gates when performing the re-simulation. Further, when comparing an actual output value with an expected output value of the corresponding test pattern, it is considered that the actual output level does not coincide with the expected output value. Accordingly, it is not necessary to compare the actual output level with the expected output value when taking the "simultaneous-change action" into consideration. That is, the expected output value is defined by the DON'T CARE value. Accordingly, in the present invention, all expected values on the test pattern at the output buffers, which the influence of the noise is propagated, are masked to the DON'T CARE values.

The operations of the simultaneous-change detection unit 32 are explained in detail by items (a) and (b) as follows.

(a) The case when the "simultaneous-change action" relates to pin positions on an LSI package, is explained below.

That is, the mutual influence of the "simultaneous-change action" at the output pins is different at each pin in accordance with pin positions on the LSI package, for example, a PGA (pin grid array) package.

Figure 2:
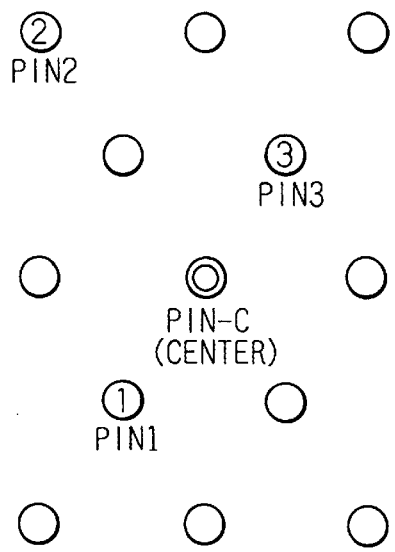
FIG. 2 shows a pin arrangement in a PGA package.

FIG. 2 shows a pin arrangement on a PGA package. In the PGA, a plurality of pins are arranged, in a staggered arrangement on the back surface of the PGA. In this example, the influence of power noise is calculated for a center pin C. In general, the influence of noise (i.e., a noise level) caused by the "simultaneous-change action" becomes smaller in accordance with the distance from the center pin C. Accordingly, it is obvious that the influence of noise at pin 2 is smaller than the influence of noise at pin 1. Further, pin 3 is located at the same distance as the pin 1 from the center pin C. Accordingly, the same influence of noise as from pin 1 is generated at pin 3, but the change time of the signal at pin 1 is different from the change time of the signal at pin 3 as explained in FIG. 3.

Figure 3A:
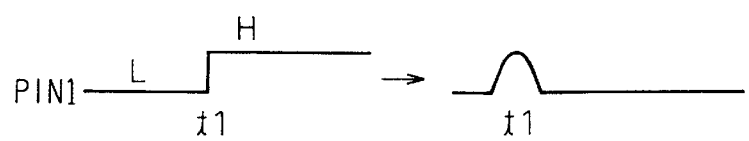
FIGS. 3A to 3C are explanatory views of the influence of noise on a center pin.
Figure 3B:
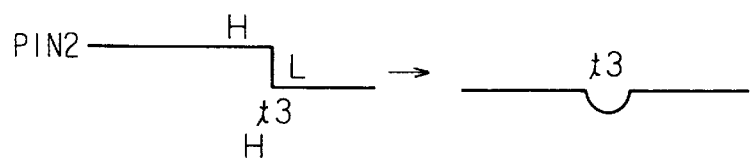
Figure 3C:
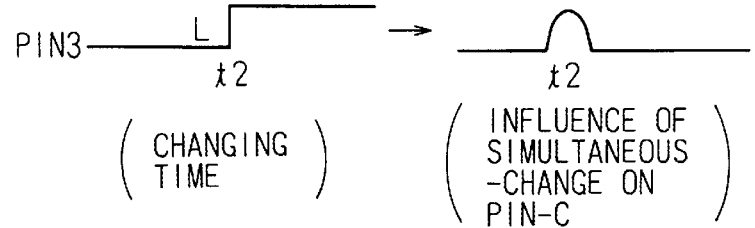

FIGS. 3A to 3C are explanatory views for influence of noise on a center pin C. FIG. 3A corresponds to pin 1, FIG. 3B corresponds to pin 2, and FIG. 3C corresponds to pin 3. The ordinate denotes a signal level and noise level, and the abscissa denotes the time. For example, in FIG. 3A, when the level of the pin 1 is changed from a low level (L) to a high level (H) at time t1, positive noise occurs on the center pin C at time t1. That is, the influence of a level change appears on the center pin C as noise. In this case, the earlier noise has the most influence on the center pin C.

Further, when the signal level of the pin 3 is changed from low level (L) to high level (H) at the time t2, positive noise appears on the center pin C at time t2. In this case, if time t2 is very close to the time t1, these noises may be superimposed on the center pin C.

Still further, when the signal level of the pin 2 is changed from the high level to the low level, negative noise appears on the center pin C at time t3. Although pin 2 is remote from the center pin C as shown in the drawing, if pin 1 and pin 2 are provided at the same distance from the center pin C, noise from pin 1 and pin 2 may be cancelled on the center pin C when time t1 is very close to time t3.

Figure 4:
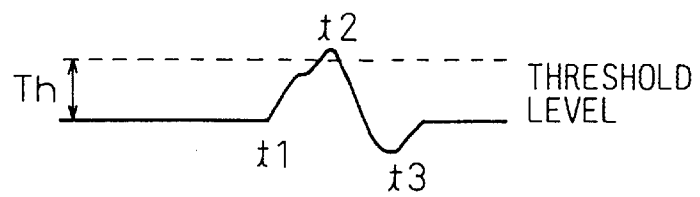
FIG. 4 is an explanatory view of the total influence of noise at a center pin.

FIG. 4 is an explanatory view of the total influence of noise at the center pin C. The times t1, t2 and t3 correspond to those in FIGS. 3A to 3C. As shown in the drawing, all noise levels are summed on the center pin C. Reference letter Th denotes a threshold level of the noise. As is obvious, the noise at the time t2 exceeds the threshold level Th. The threshold level Th is determined as the level which can distinguish the pin to which noises, caused by the "simultaneous-change action", are applied.

Figure 5:
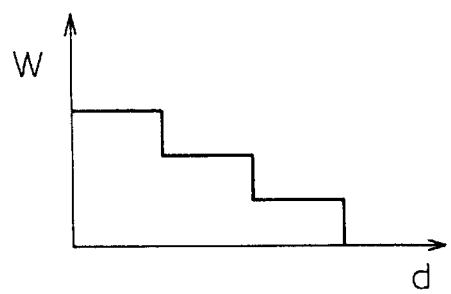
FIG. 5 is an explanatory view of a weighted noise level in accordance with distance between the input/output pins to be checked.
Figure 6:
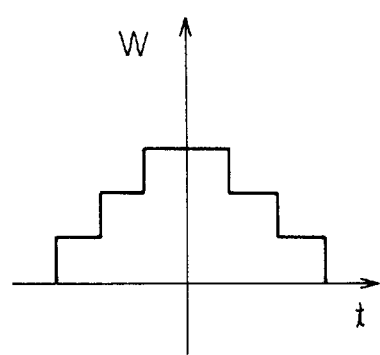
FIG. 6 is an explanatory view of weighted noise level in accordance with a time difference between input/output pins to be checked.

FIG. 5 is an explanatory view of noise weighted in accordance with distance between the input/output pins to be checked, and FIG. 6 is an explanatory view of noise weighted in accordance with the time difference between the input/output pins to be checked.

In the actual calculation, the sum of noises (N) can be calculated in accordance with the following formula.

$$N(t) = \epsilon[SUDi * Wd(|Pi-P|) * Wt(|ti-t|)] \quad (1)$$

In the equation, N(t) can be calculated as the noise at the time "t" on the center pin C to be checked. "SUDi" denotes the change of the signal level at the "i"-th change from the high level to the low level (DOWN, or −1), or from the low level to the high level (UP, or +1). "Pi" denotes the pin position at the "i"-th change. "P" denotes the pin C position selected in order to check the noise caused by the "simultaneous-change action". |Pi−P| denotes the distance between the pin at the "i"-th change and the center pin C.

Further, "Wd" denotes a function which weights the noise with regard to the distance as shown in FIG. 5. In FIG. 5, the ordinates denote the weighted noise level, and the abscissa denotes the distance. Still further, "Wt" denotes a function which weights the noise with regard to the times when the noise occurs as shown in FIG. 6. In FIG. 6, the ordinate denotes the weighted noise level and the abscissa denotes the time. In the formula, the time difference is expressed by |ti−t|.

When the sum of noises |N(t)| ≧ Th, the noise occurs on the center pin "C" at the time "t". For example, in FIG. 2, the noise occurs on the pin C at the time t2.

(b) The case when the "simultaneous-change action" problem relates to pad positions on an LSI chip is explained below.

Figure 7:
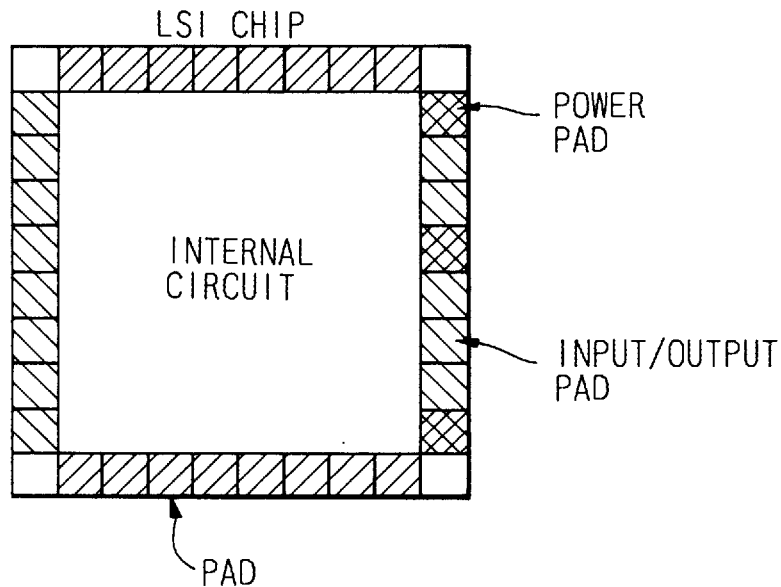
FIG. 7 shows an arrangement of pads on an LSI chip.

FIG. 7 shows an arrangement of pads on an LSI chip. As shown in the drawing, a plurality of pads Pd are provided around the LSI chip, and these pads are used for the power sources (power-pads) and the input/output signals (signal-pads). In general, a plurality of input/output signal are provided in common for the same power source, and these signal-pads may be arranged to the same side of the LSI chip. Accordingly, when the signal levels at the signal-pads are simultaneously changed, considerable noise occurs on the power line.

Further, when a plurality of signal-pads on the same side are changed, a large amount of noise occurs on other signal-pads on the same side. In this case, it is relatively easy to detect the influence of the "simultaneous-change action". An evaluation formula is expressed as follows.

$$N(e) = \epsilon[SWi(e)] \quad (2)$$

Where, "e" denotes one side of the LSI chip. "SWi(e)" is expressed by "+1" when the pin at the "i"-th change is located in the side "e", and expressed by "0" when the pin at the "i"-th change is not located in the side "e".

When the input/output pins on the same side "e" are changed (threshold number Te), and when the sum |N(e)| ≧ Te, noise occurs on the pins at the same side "e".

Next, the operation of the pattern masking unit 33 is explained in detail below.

The following explanations are given to a masking process for a function test pattern. A method for masking the test pattern is explained below. That is, the test pattern is provided to detect so-called "stuck-at fault" of "0" or "1" in the LSI circuit, and a part of the test pattern is masked taking the "simultaneous-change action" into consideration.

In general, the LSI circuit includes a plurality of sequential circuit elements, and each of these elements is controlled by applying pulses to the input pins thereof. In this case, the input pins relate to either clock signals for receiving data, or reset signals for set/reset operations.

Figure 8:
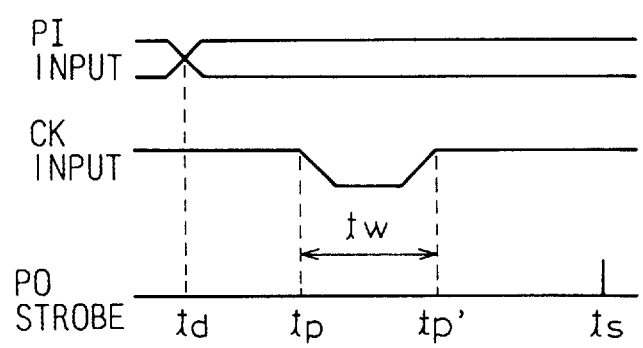
FIG. 8 is a signal timing-chart for a function test pattern.
Figure 9A:
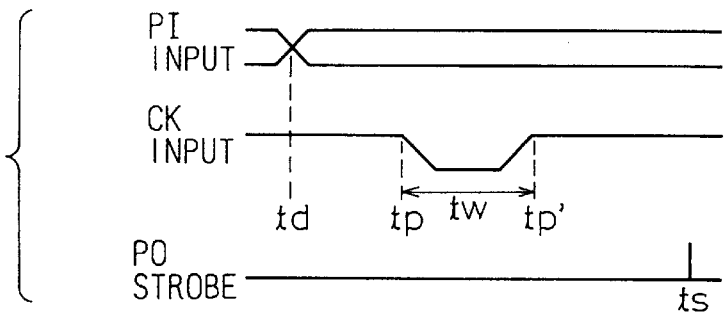
Figure 9B:
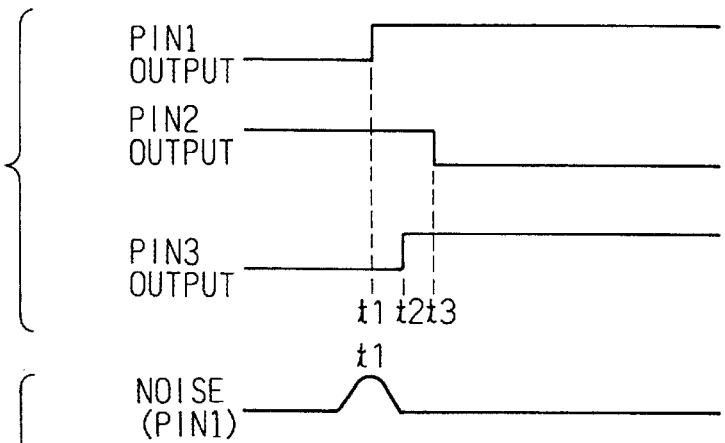
Figure 9C:
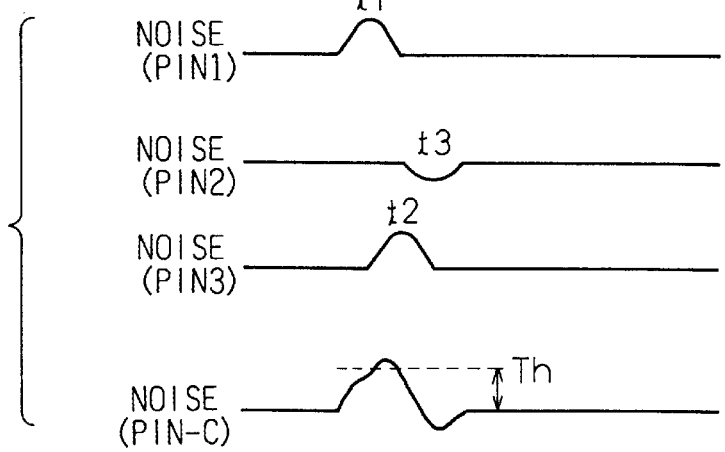

FIG. 8 is a signal timing-chart for a function test pattern which tests the function of the circuit. In the drawing, PI denotes an input pin for inputting the test pattern, and PO denotes an output pin for outputting strobe signal. Further, CK denotes a clock signal which is input to the pulse pin.

The input at the pin PI is changed at the time "td", and the level of the pulse pin is changed at the time "tp". Further, the change of the pulse pin is maintained during the time interval "tw". Still further, the time "ts" denotes the strobe time on the pin PO to check the output of the test pattern. In this case, the relatively long time is provided from the time "tp'" at the trailing edge of the pulse until the time "ts" in order to stabilize the internal circuit.

In this case, it is assumed that noises caused by the "simultaneous-change action" are also stabilized at the time "ts". Accordingly, this embodiment discusses the following situation, i.e., noise occurs on the pulse pin CK caused by the "simultaneous-change action" so that the sequential circuit elements (for example, FF, latch circuit, RAM, ROM) are affected by the noise. Accordingly, it is sufficient that the detection of the "simultaneous-change action" is performed for the input pins (pulse pins, pulse control pins). All input pins which can be back-traced are defined as the pulse pins in the sequential circuit elements.

FIGS. 9a to 9D are signal timing-charts for explaining an event at a re-simulation by the function test pattern on the center pin C. In the drawing, PI, PO and CK correspond to those of FIG. 8, the pins 1, 2 and 3 correspond to those of FIG. 3, and the center pin C corresponds to FIG. 4, respectively.

Further, the center pin C corresponds to the pulse input pin. The logic-simulation process is again performed by adding an event (this means the change of the value, for example, 0→X, or X→0) of the DON'T CARE value (X) at the center pin C. In this case, the pins, in which the noise may be superimposed, and the time when the noise occurs, are previously recorded in the pattern masking unit 33.

In the masking process, the simulation is again performed by adding the event of the DON'T CARE value (X) to the input pin which the noise-occurring time is already recorded, and by using the same pattern. That is, the same test pattern as the first logic simulation is used for the second logic simulation. In this case, since the situation of the sequential circuit elements already changes when applying the test pattern, it is necessary to return the circuit to the previous situation before the second logic simulation is performed.

During the logic simulation based on the above method, the expected value of the test pattern is compared with the result of the logic simulation at the strobe time "ts" on the output pin. As a result of the comparison, for the output pins which have different value from the expected value, the expected value of the test pattern is masked by the DON'T CARE value (X).

The following is an explanation of the preparation of a delay test pattern for detecting a delay failure in the circuit.

Figure 10:
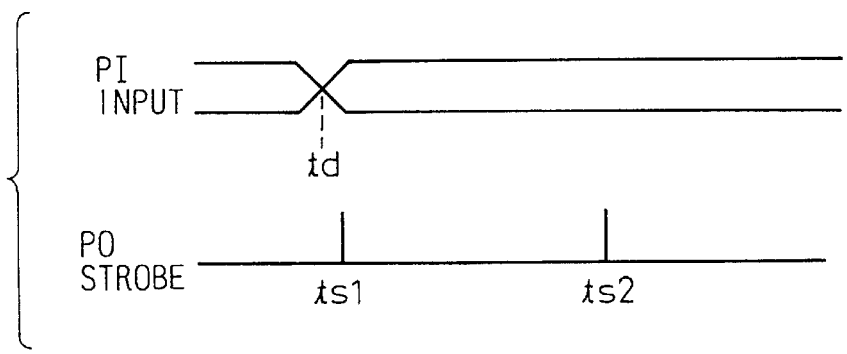
FIG. 10 is a signal timing-chart for explaining a delay test pattern.

FIG. 10 is a signal timing-chart for explaining the delay test pattern. The time "ts1" and "ts2" denote the strobe time, and denote the delay from the time "td". A method for masking the delay test pattern in consideration of the "simultaneous-change action" is explained below. In the delay test of the circuit, the test pattern is prepared by considering one particular route (this route is called a "path") which is provided from the input buffer to the output buffer through the internal circuit.

As mentioned above, PI denotes the input pin, and PO denotes the output pin for the strobe. In the test pattern for detecting the delay failure, only the input pin PI is changed at the time "td". The strobe time "ts2" is dependent on the path delay. In general, the strobe time "ts" is changed in accordance with the total delay in the object path to be measured. As is obvious, it is not ensured that the circuit situation is stable at the strobe time. Accordingly, it is necessary to consider the effect of "simultaneous-change action" problem on the output pins of the object path.

In this case, the sequential circuit elements are handled using the same method as the masking process of the function test pattern which was previously explained, and the "simultaneous-change action" for the input buffer of the pulse signal is also handled using the same method as the masking process of the function test pattern. Accordingly, the "simultaneous-change action" for the output pin is explained below. The detection of the "simultaneous-change action" on the output pin is performed in the simultaneous-change detection unit 32, and the time when the noise occurs on the output pin is recorded therein.

Figure 11:
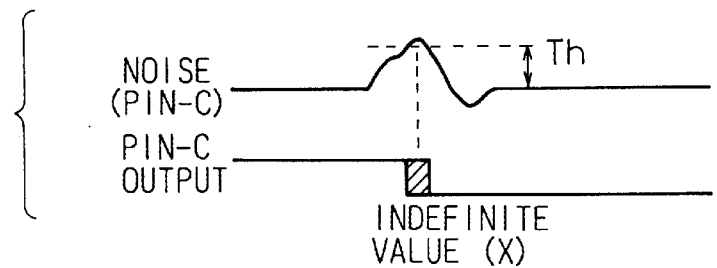
FIG. 11 is a signal timing-chart for explaining an event, during a re-simulation using the delay test pattern, at the center pin.

FIG. 11 is a signal timing-chart for explaining an event during the second simulation of the delay test pattern on the center pin C. In the second simulation, the same signal timing-charts as those shown in FIGS. 9A to 9D are used. The center pin C corresponds to the target output pin, and the second logic simulation is performed by adding the event (0→X, or X→0) for the DON'T CARE value (X). As a result of comparison of the simulation values on the output pin at the strobe time, if the DON'T CARE value becomes the value "X" under the influence of the "simultaneous-change action", the expected value is masked to the value "X".

I claim:

1. A test pattern preparation system for testing an LSI circuit, the system comprising:

a circuit data file storing circuit data;

an old test signal pattern file storing old test signal patterns;

a test signal pattern preparation means, operatively connected to the circuit data file and the old test signal pattern file, for performing a logic simulation, detecting simultaneous-change action based on a result of the logic simultaneous-change action based on a result of the logic simulation, and preparing a new test signal pattern in accordance with the circuit data and the old test signal patterns; and a new test signal pattern file operatively connected to the test signal pattern preparation means for storing the new test signal pattern prepared by the test signal pattern preparation means, and wherein said test signal pattern preparation means comprises:

a logic simulation unit receiving the circuit data from the circuit data file and the old test signal patterns from the old test signal pattern file; performing the logic simulation in consideration of signal delay; and recording names of input/output pins at which a signal level was changed, any change of the signal level before and after the change, and the time when the signal level changed;

a simultaneous-change detection unit calculating a sum of noise levels at input/output pins which are provided in vicinity of a target input/output pin to be checked in accordance with the result of the logic simulation, and recording the sum of the noise levels caused by the simultaneous-change action at the input/output pins when the sum of the noise levels exceeds a threshold value which is previously determined; and a pattern masking unit setting the signal levels at input/output pins, where noises are considered, to a DON'T CARE value, performing a re-simulation, and masking all expected values on the test pattern at the output pins, when influence of the noise is propagated to the DON'T CARE value.

2. A test pattern preparation system as claimed in claim 1, wherein said simultaneous-change detection unit obtains weighted noise levels in accordance with a distance between input/output pins to be checked when calculating the sum of the noise levels.

3. A test pattern preparation system as claimed in claim 1, wherein said simultaneous-change detection unit obtains weighted noise levels in accordance with a time difference between input/output pins to be checked when calculating the sum of the noise levels.

* * * * *